(12) United States Patent
Wang et al.

(10) Patent No.: US 7,456,769 B2
(45) Date of Patent: Nov. 25, 2008

(54) REFERENCE VOLTAGE GENERATING CIRCUIT

(75) Inventors: Wen-Chi Wang, Yun-Lin Hsien (TW);
Chang-Shun Liu, Taipei (TW);
Chao-Cheng Lee, Hsin-Chu (TW);
Jui-Yuan Tsai, Tai-Nan (TW)

(73) Assignee: Realtek Semiconductor Corp., HsinChu (TW)

( * ) Notice: Subject to any disclaimer, the term of this patent is extended or adjusted under 35 U.S.C. 154(b) by 154 days.

(21) Appl. No.: 11/459,364

(22) Filed: Jul. 24, 2006

(65) Prior Publication Data
US 2007/0030037 A1 Feb. 8, 2007

(30) Foreign Application Priority Data
Aug. 2, 2005 (TW) .............................. 94126226 A

(51) Int. Cl.
*H03M 3/00* (2006.01)
(52) U.S. Cl. ...................................... 341/143; 341/150
(58) Field of Classification Search ................. 341/143, 341/150
See application file for complete search history.

(56) References Cited

U.S. PATENT DOCUMENTS

| | | | | |
|---|---|---|---|---|
| 4,588,981 A | * | 5/1986 | Senn | 341/143 |
| 5,162,801 A | * | 11/1992 | Powell et al. | 341/150 |
| 5,352,972 A | * | 10/1994 | Pernici et al. | 323/313 |
| 5,608,345 A | * | 3/1997 | Macbeth et al. | 327/337 |
| 6,055,168 A | * | 4/2000 | Kotowski et al. | 363/60 |
| 6,147,522 A | | 11/2000 | Rhode et al. | |
| 6,323,801 B1 | * | 11/2001 | McCartney et al. | 341/172 |
| 6,396,334 B1 | * | 5/2002 | Aram | 327/541 |
| 7,129,875 B1 | * | 10/2006 | Altun et al. | 341/143 |

\* cited by examiner

*Primary Examiner*—Howard Williams
(74) *Attorney, Agent, or Firm*—Winston Hsu

(57) ABSTRACT

A reference voltage generating circuit includes a first capacitor having a first end and a second end; a second capacitor having a third end and a fourth end; a first switch for selectively coupling a predetermined voltage to the first end of the first capacitor; a second switch for selectively coupling the third end of the second capacitor to the first end of the first capacitor; a third switch for selectively coupling the first end of the first capacitor to a reference voltage level; and a fourth switch for selectively coupling the second end of the first capacitor to a reference voltage level; wherein the first capacitor samples the predetermined voltage in a first stage and re-distributes charges to the second capacitor in a second stage.

6 Claims, 13 Drawing Sheets

REFERENCE VOLTAGE GENERATING CIRCUIT

BACKGROUND OF THE INVENTION

1. Field of the Invention

The invention relates to a reference voltage generating circuit, and more particularly, to a reference voltage generating circuit that quickly switches a capacitor to filter out noise of a predetermined voltage in order to generate a reference voltage.

2. Description of the Prior Art

In the fields of digital-to-analog converters (DAC) and analog-to-digital converters (ADC), the allowable range of amplitudes of an input signal is determined according to the relative voltage levels of the positive and negative reference voltages. The noise standard of each circuit in an ADC or DAC is also determined by the allowable range. In other words, if the relative level of the reference voltage is larger, the design complexity corresponding to the noise is lower.

The relative reference voltage levels generated inside the IC, however, are lower than those generated outside the IC. Therefore, the external voltage source $V_{DD}$ and the ground voltage GND are generally utilized to generate needed reference voltages.

Please refer to FIG. 1, which is a diagram of a conventional reference voltage generating circuit 100. As shown in FIG. 1, the reference voltage generating circuit 100 is an RC circuit, and the external voltage $V_{DD}$ may have noise. After filtering by the RC circuit 100, a clean reference voltage can be generated and provided to a chip.

Unfortunately, a problem is encountered. For example, when the reference voltage generating circuit 100 is utilized in an audio-band analog-to-digital converter (audio-band ADC), for the audio band is about 20 Hz~20000 Hz, the reference generating circuit 100 should comprise both a large capacitor and resistor to make the corner (−3 db) frequency lower than 20 Hz. Obviously, utilizing a large capacitor and resistor is not a good method of saving costs.

Furthermore, in the application of audio band ICs, power supply rejection ratio (PSRR) is often measured to guarantee that the PSRR can be lower than −60 db in 20 Hz~20 KHz. If the conventional method is utilized to generate the reference voltage, the PSRR is almost equal to the frequency response of the first order low pass filter. If the corner frequency is at 2 Hz, the PSRR is equal to −20 db at 20 Hz, and −40 db at 200 Hz. Obviously, the PSRR cannot always be lower than −60 db in the frequency band.

SUMMARY OF THE INVENTION

It is therefore one of the primary objectives of the claimed invention to provide a reference voltage generating circuit that quickly switches capacitors to filter out noise of a predetermined voltage in order to generate a reference voltage, to solve the above-mentioned problem.

According to an exemplary embodiment of the claimed invention, a reference voltage generating circuit for receiving a predetermined voltage and filtering the predetermined voltage to generate a reference voltage is disclosed. The reference voltage generating circuit comprises: a first capacitor, comprising a first end and a second end; a second capacitor, comprising a third end and a fourth end; a first switch, for alternatively coupling the predetermined voltage to the second end of the first capacitor; a second switch, for alternatively coupling the third end of the second capacitor to the first end of the first capacitor; a third switch, for alternatively coupling the first end of the first capacitor to a reference level; and a fourth switch, for alternatively coupling the second end of the first capacitor to the reference level; wherein the first capacitor samples the predetermined voltage in a first stage, and redistributes charges to the second capacitor to generate the reference voltage in a second stage.

According to another exemplary embodiment of the claimed invention, a sigma delta digital-to-analog converter comprises: a reference voltage generating circuit, for receiving a predetermined voltage and filtering the predetermined voltage to generate a reference voltage; and a sigma delta modulator, for receiving the reference voltage from the reference voltage generating circuit and generating an analog signal according to a digital signal in the third stage. The reference voltage generating circuit comprises: a first capacitor, comprising a first end and a second end; a second capacitor, comprising a third end and a fourth end, a first switch, for alternatively coupling the predetermined voltage to the second end of the first capacitor, where the first switch couples the predetermined voltage to the first capacitor in a first stage, and disconnects the predetermined voltage and the first capacitor in a second stage and a third stage; a second switch, for alternatively coupling the first end of the first capacitor to the third end of the second capacitor, where the second switch couples the third end of the second capacitor to the first end of the first capacitor in the second stage, and disconnects the first capacitor and the second capacitor in the first stage and the third stage; a third switch, for alternatively coupling the first end of the first capacitor to a reference level, where the third switch couples the first end of the first capacitor to the reference level in the first stage, and disconnects the first capacitor and the reference level in the second stage and the third stage; and a fourth switch, for alternatively coupling the second end of the first capacitor to the reference level, where the fourth switch couples the second end of the first capacitor to the reference level in the second stage, and disconnects the first capacitor and the reference level in the first stage and the third stage; wherein the first capacitor samples the predetermined voltage in the first stage, and redistributes charges to the second capacitor in the second stage in order to generate the reference voltage.

According to another exemplary embodiment of the claimed invention, a sigma delta analog-to-digital converter comprises: a reference voltage generating circuit, for receiving a predetermined voltage and filtering the predetermined voltage to generate a reference voltage; and a sigma delta modulator, for receiving the reference voltage in the third stage, and receiving an input analog signal in the first and the second stages to generate a digital signal. The reference voltage generating circuit comprises: a first capacitor, comprising a first end and a second end; a second capacitor, comprising a third end and a fourth end; a first switch, for alternatively coupling the second end of the first capacitor to the predetermined voltage, where the first switch couples the predetermined voltage to the first capacitor in a first stage, and disconnects the predetermined voltage and the first capacitor in a second stage and a third stage; a second switch, for alternatively coupling the first end of the first capacitor to the third end of the second capacitor, where the second switch couples the third end of the second capacitor to the first end of the first capacitor in the second stage, and disconnects the first capacitor and the second capacitor in the first stage and the third stage; a third switch, for alternatively coupling the first end of the first capacitor to a reference level, where the third switch couples the first end of the first capacitor to the reference level in the first stage, and disconnects the first capacitor and the reference level in the second stage and the third stage; and a fourth switch, for alternatively coupling the second end of the first capacitor to the reference level, where the fourth switch couples the second end of the first capacitor to the reference level in the second stage, and disconnects the first capacitor and the reference level in the first stage; wherein the first capacitor samples the predetermined voltage in the first stage, and redistributes charges to the second capacitor in the second stage to generate the reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
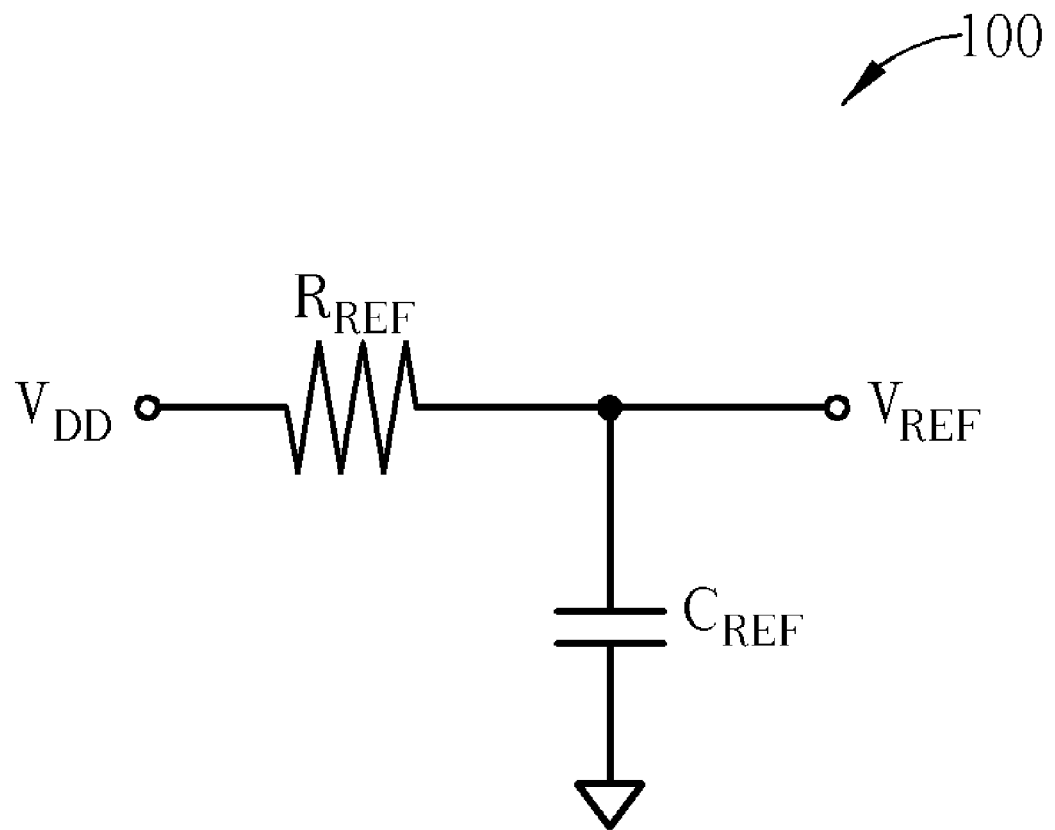
FIG. 1 is a diagram of a conventional reference voltage generating circuit.
Figure 2:
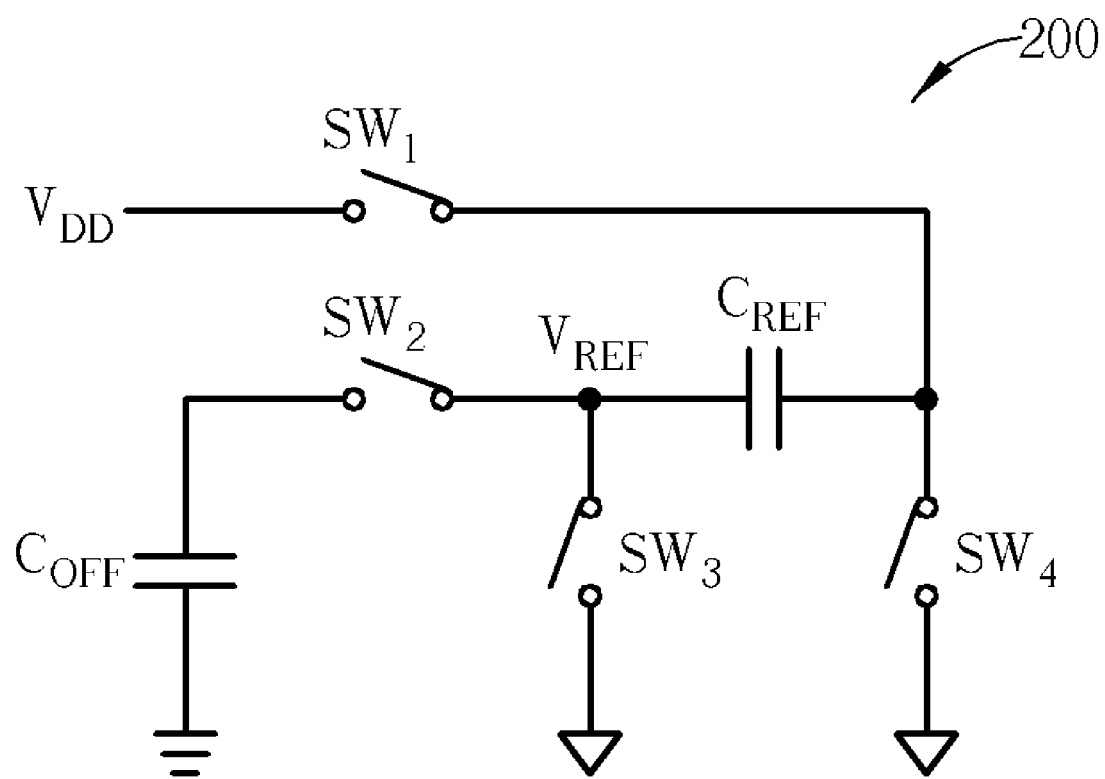
FIG. 2 is a diagram of a reference voltage generating circuit according to the present invention.

Please refer to FIG. 2, which is a diagram of a reference voltage generating circuit 200 according to the present invention. The reference voltage generating circuit 200 comprises four switches SW1, SW2, SW3, and SW4, an off-chip capacitor $C_{OFF}$, and a capacitor $C_{REF}$. Their connections are as shown in FIG. 2. Please note that switches SW1 and SW3 are controlled by a first clock, and switches SW2 and SW4 are controlled by a second clock, where the first clock is the inverse of the second clock.

When the first clock corresponds to a high voltage level, the switches SW1 and SW3 are turned on, and because the first clock is the inverse of the second clock, when the second clock corresponds to a low voltage level, the switches SW2 and SW4 are turned off. At this time, the capacitor $C_{REF}$ is coupled to the external voltage source $V_{DD}$, and the capacitor $C_{REF}$ and the external voltage source $V_{DD}$ form a close loop. Therefore, the capacitor $C_{REF}$ samples the external voltage source $V_{DD}$. Similarly, when the second clock corresponds to a high voltage level, the switches SW2 and SW4 are turned on and the switches SW1 and SW3 are turned off. Therefore, the capacitor $C_{REF}$ and the off-chip capacitor $C_{OFF}$ form a close loop such that the capacitor $C_{REF}$ redistributes charges with the off-chip capacitor $C_{OFF}$. The reference voltage $V_{REF}$ is thus generated.

In other words, because of the alternative operations of the switches SW1, SW2, SW3, and SW4, the capacitor $C_{REF}$ functions as a resistor. In general, the corresponding resistance is substantially equal to the ratio of the clock period to the capacitance of the capacitor $C_{REF}$ (resistance R=clock period T/capacitance $C_{REF}$). Therefore, the present invention reference voltage generating circuit 200 not only achieves the same goal of the prior art reference voltage generating circuit 100, but also eliminates the need for a large resistor.

The aforementioned reference voltage generating circuit 200 can be utilized in a sigma-delta ADC to generate needed reference voltages. Generally speaking, the sigma-delta ACD can comprise a reference voltage generating circuit 200 and a sigma-delta modulator. As is known, the sigma-delta modulator can generate a corresponding digital signal according to an input analog signal and the reference voltage generated by the reference voltage generating circuit 200. As known by those skilled in the art, the sigma-delta modulator can comprise an integrator, a quantizer, and a low-pass digital filter, to control the reference voltage according to a feedback signal of the quantizer. In the following disclosure, the quantizer and the low-pass digital filter are well known, and thus omitted. The co-operation of the reference voltage generating circuit 200 and the integrator are focused.

Figure 3:
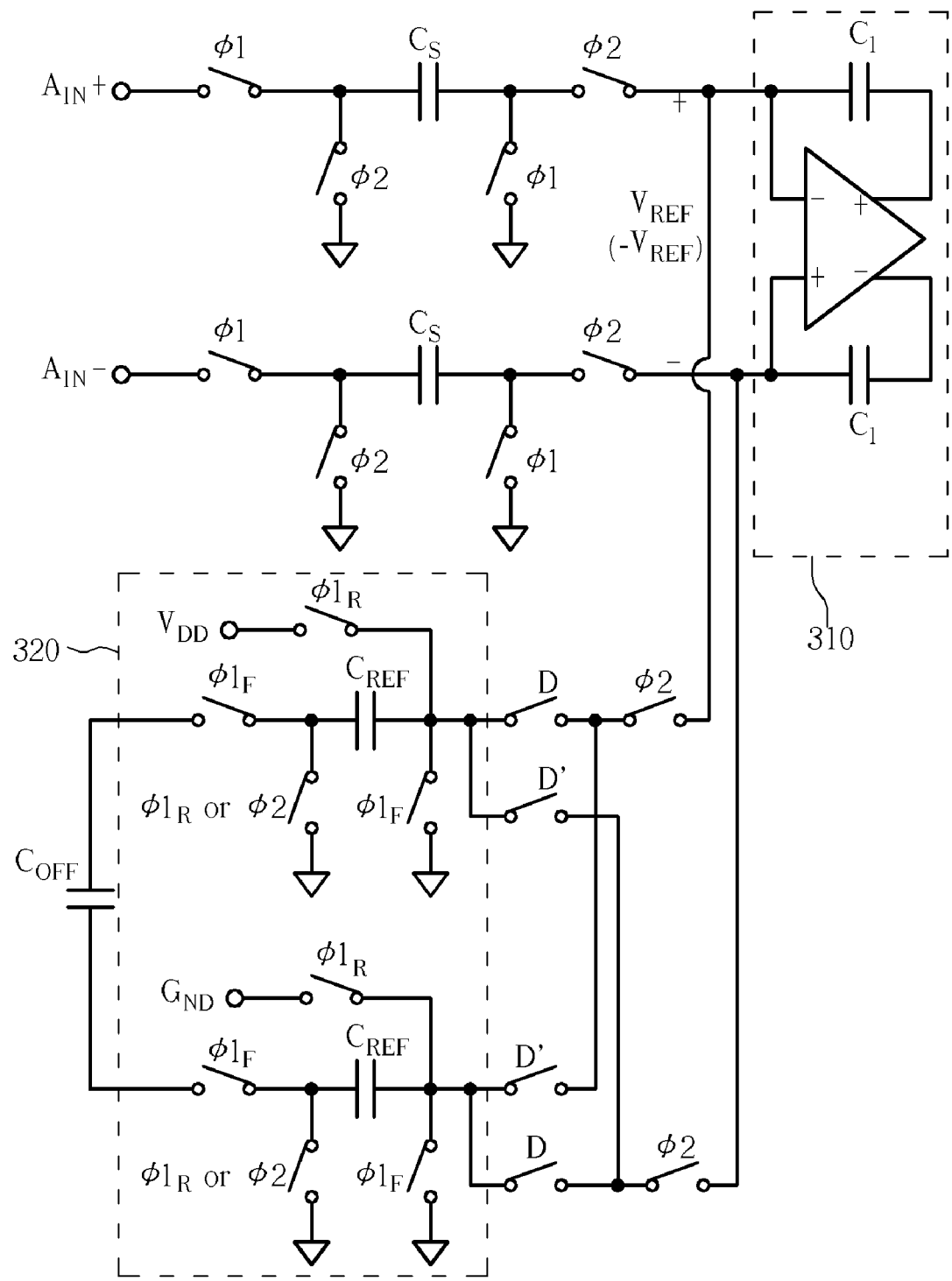
FIG. 3 is a detailed circuit diagram of a reference voltage generating circuit and an integrator inside a sigma-delta ADC according to the present invention.
Figure 4:
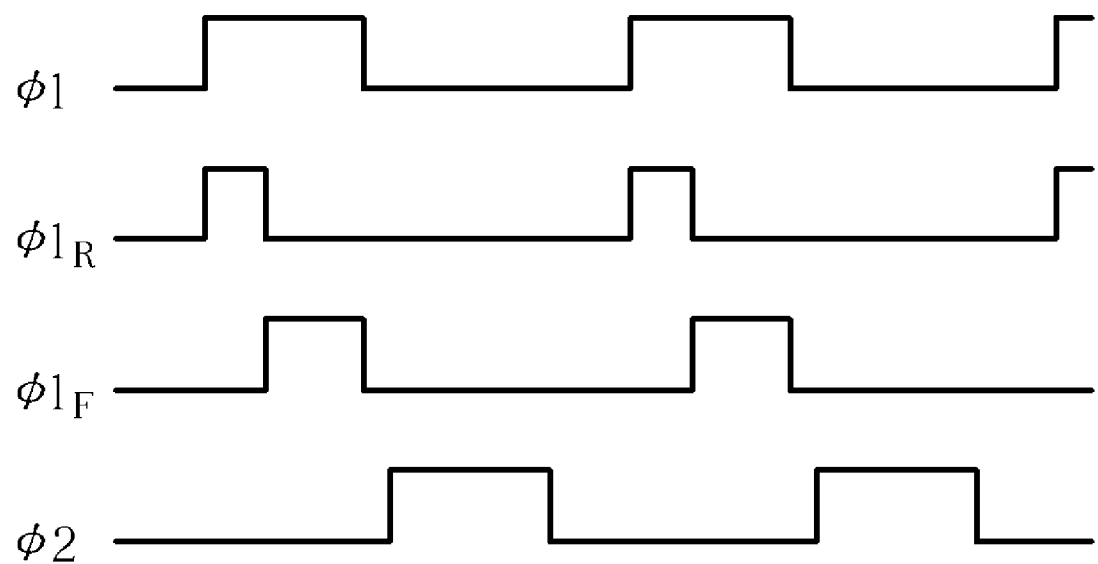
FIG. 4 is a diagram of control clocks of the sigma-delta ADC according to the present invention.

Please refer to FIG. 3 and FIG. 4. FIG. 3 is a detailed circuit diagram of a reference voltage generating circuit 320 and an integrator 310 inside a sigma-delta ADC according to the present invention. FIG. 4 is a diagram of control clocks of the sigma-delta ADC according to the present invention. Please note that the integrator 310 is a non-reversed integrator. In the following disclosure, the operations of the integrator 310 and the reference voltage generating circuit 320 are illustrated.

Figure 5:
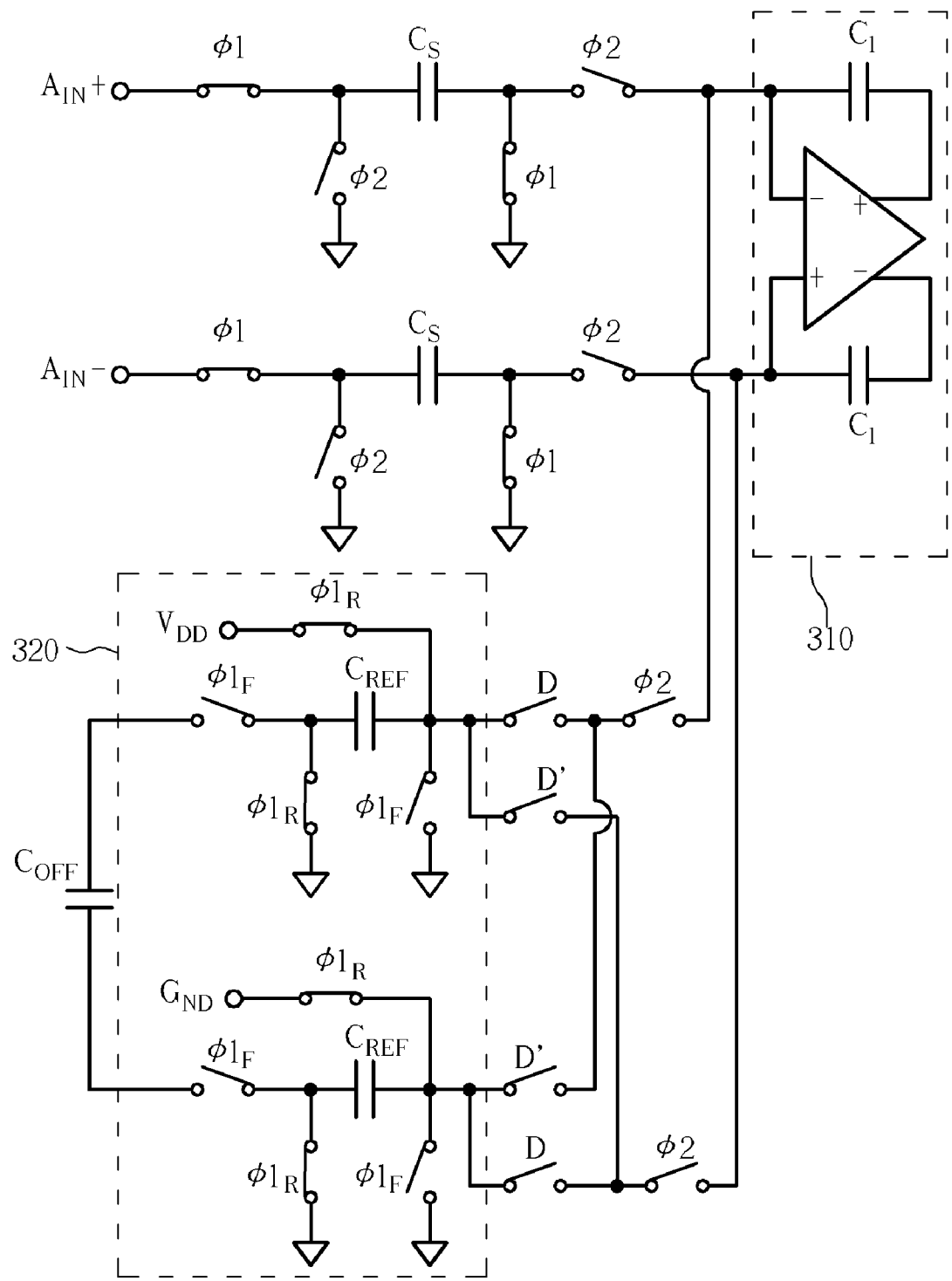
FIG. 5 is a diagram of the reference voltage generating circuit and the integrator shown in FIG. 3 in a first stage.

First, please note that in FIG. 3, each switch has a symbol representing the clock (i.e. the clock the switch is controlled by) corresponding to the switch. The whole circuit is controlled by four control clocks. Please refer to FIG. 5, which is a diagram of the reference voltage generating circuit 320 and the integrator 310 shown in FIG. 3 in a first stage. As shown in FIG. 5, in the first stage, the capacitor $C_{REF}$ is coupled to the external voltage source $V_{DD}$ or the ground voltage GND. Therefore the capacitor $C_{REF}$ samples the external voltage source $V_{DD}$ or the ground voltage GND. On the other hand, the sampling capacitor $C_S$ begins to sample an input signal Vin.

Figure 6:
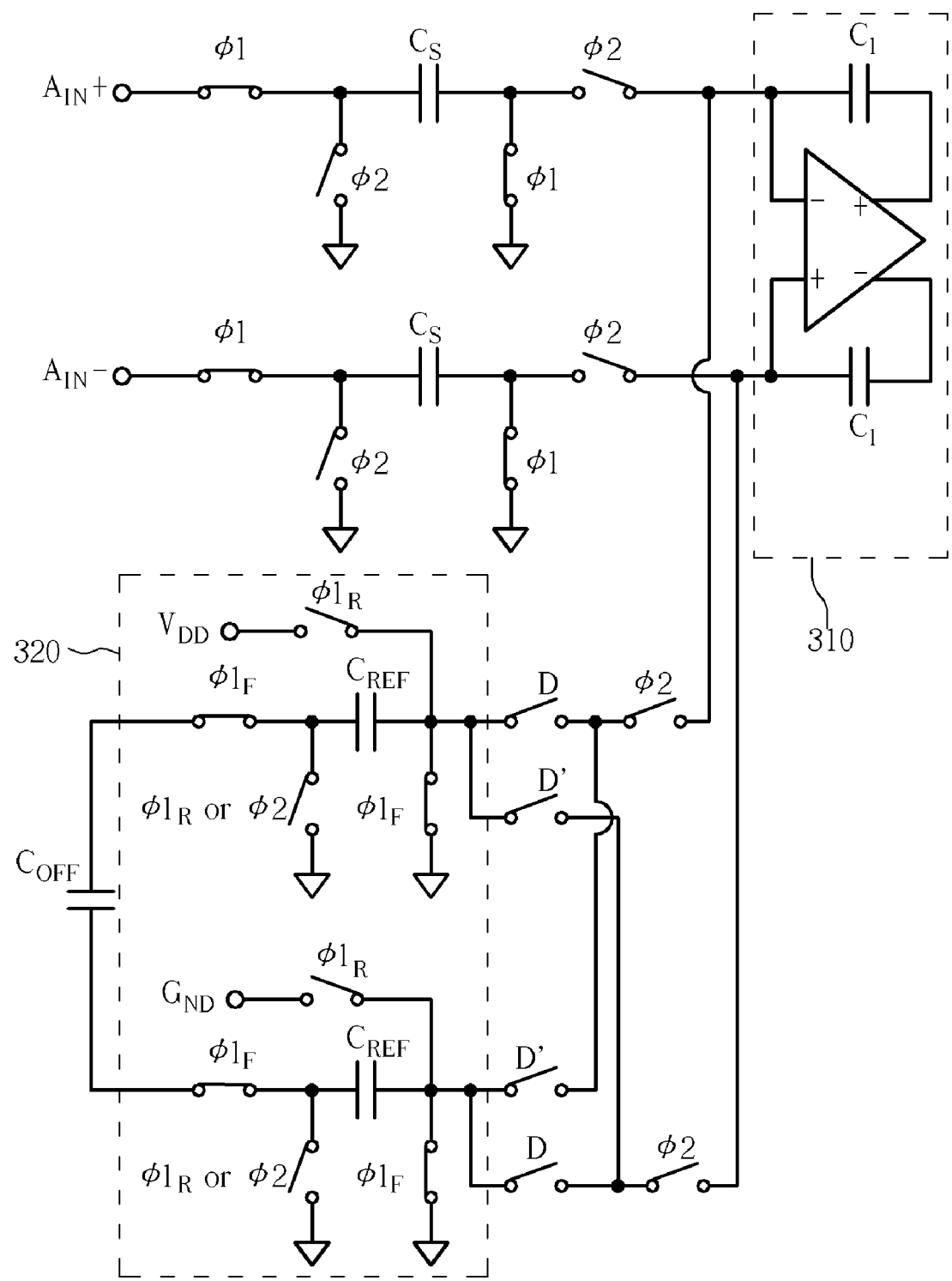
FIG. 6 is a diagram of the reference voltage generating circuit and the integrator shown in FIG. 3 in a second stage.

Please refer to FIG. 6, which is a diagram of the reference voltage generating circuit 320 and the integrator 310 shown in FIG. 3 in a second stage. As shown in FIG. 6, in the second stage, the capacitor $C_{REF}$ is coupled to the off-chip capacitor $C_{OFF}$ such that the capacitor $C_{REF}$ redistributes charges to the off-chip capacitor $C_{OFF}$ to generate the reference voltage $V_{REF}$. On the other hand, the sampling capacitor $C_S$ still samples the input signal Vin inside the reference voltage generating circuit 320

Figure 7:
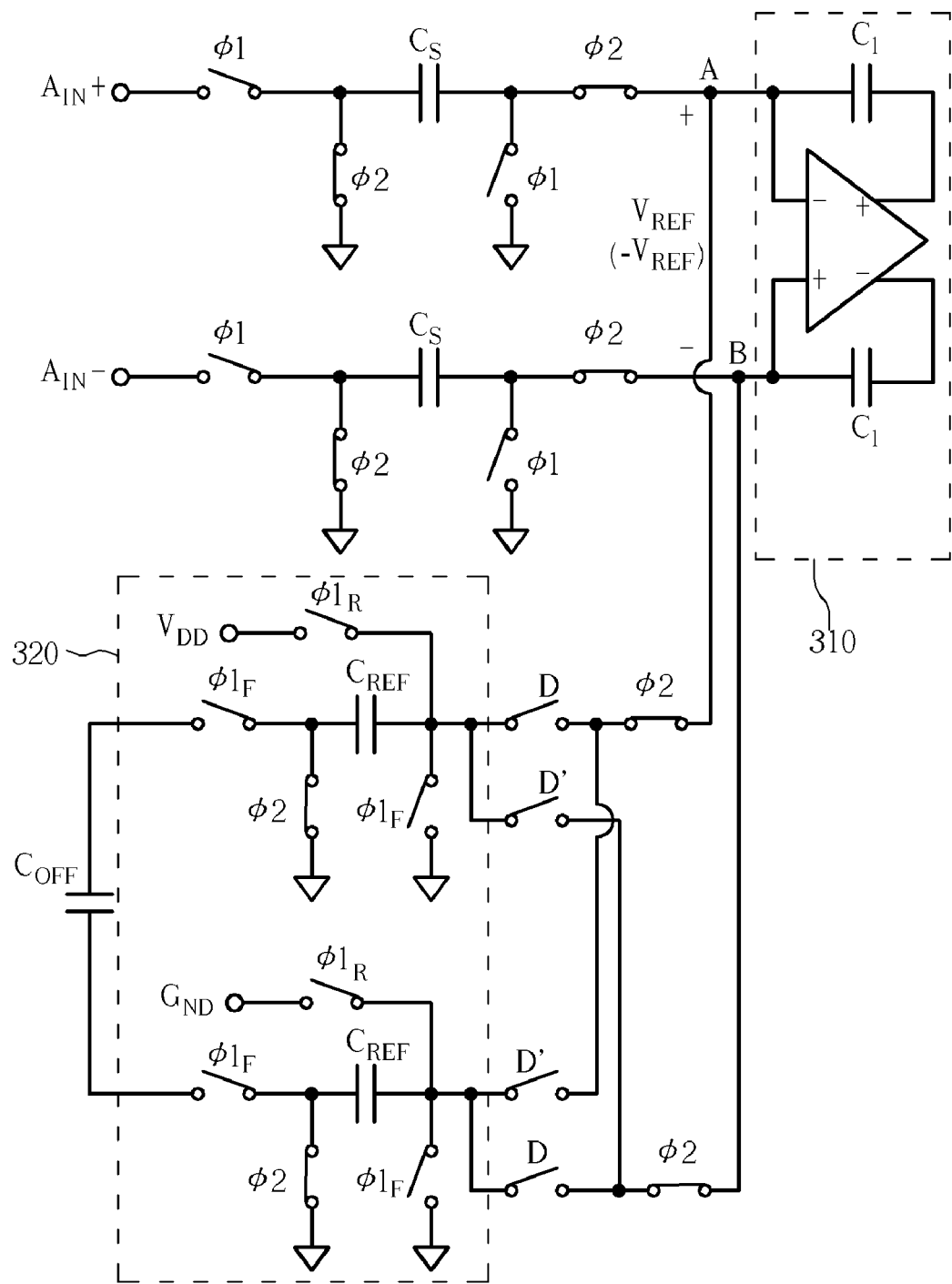
FIG. 7 is a diagram of the reference voltage generating circuit and the integrator shown in FIG. 3 in a third stage.

Please refer to FIG. 7, which is a diagram of the reference voltage generating circuit 320 and the integrator 310 shown in FIG. 3 in a third stage. As shown in FIG. 7, in the third stage, the reference voltage $V_{REF}$ has been stored in the capacitor $C_{REF}$, and the sampled input signal Vin has been stored in the capacitor $C_S$. Therefore, the sampled input signal Vin stored inside the capacitor $C_S$ is redistributed to the capacitor $C_1$. The reference voltage is fed back to the nodes A and B according to digital signals D (or D') outputted by the above-mentioned digital low-pass filter. Therefore, the integrator 310 can smoothly integrate signals according to the input signal Vin and the feedback reference voltage $V_{REF}$, allowing the whole sigma-delta ADC to work normally and correctly.

Figure 8:
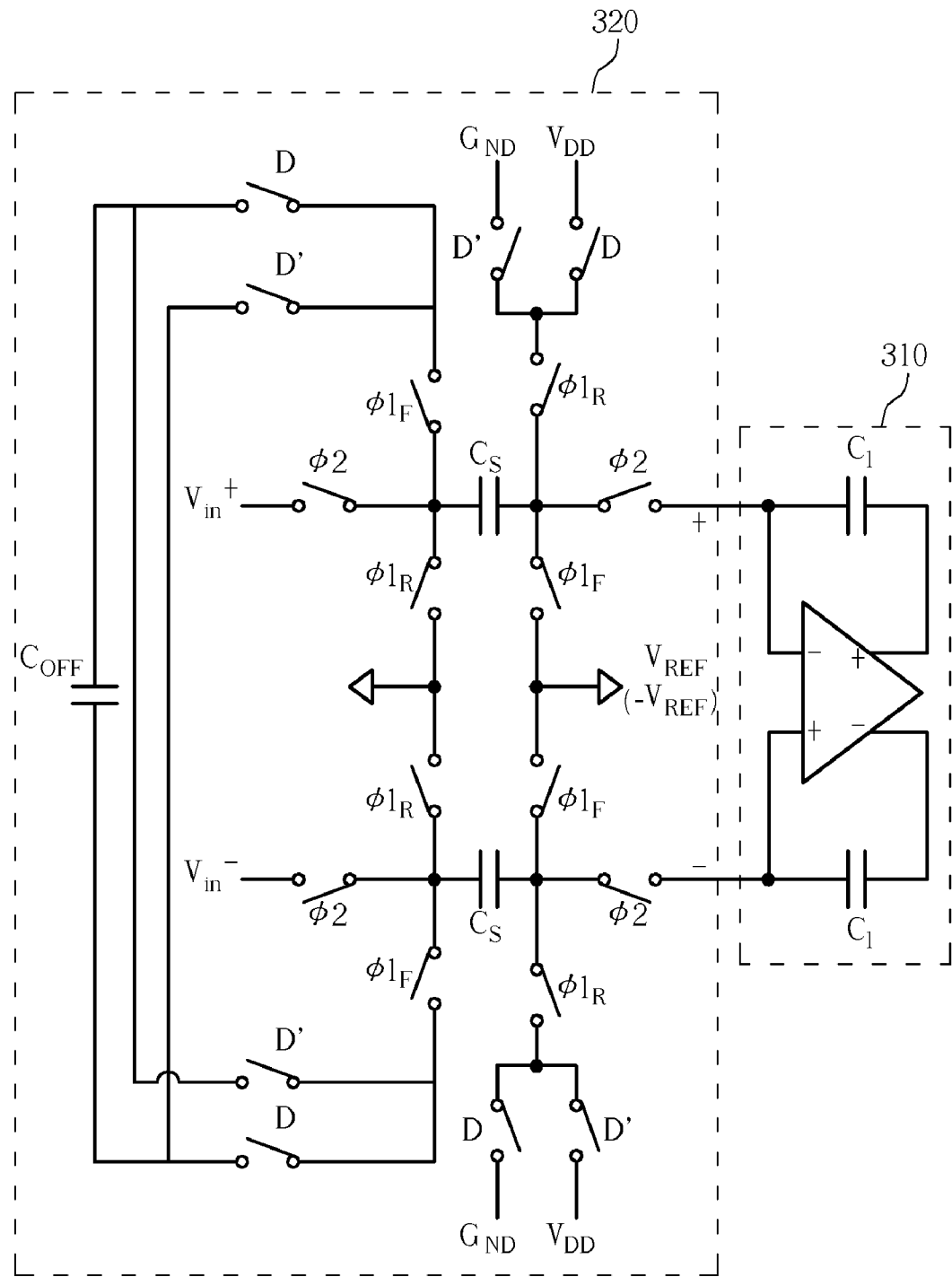
FIG. 8 is a detailed circuit diagram of the integrator and the reference voltage generator of another embodiment according to the present invention.

Please refer to FIG. 8, which is a detailed circuit diagram of the integrator 310 and the reference voltage generator 320 of another embodiment according to the present invention. Please note that in this embodiment, the integrator 310 is a reversed integrator. As shown in FIG. 8, the sampling capacitor $C_S$ not only has to sample the input signal Vin in the third stage, but also is utilized as the above-mentioned capacitor $C_{REF}$ in the first and the second stages. In other words, the reference voltage generating circuit 320 and the integrator 310 shares a same sampling capacitor $C_S$. Please note that each switch also corresponds to the control clocks shown in FIG. 4. The difference between this embodiment and the embodiment shown in FIG. 3 is: in this embodiment, the reference voltage $V_{REF}$ (or the negative reference voltage $-V_{REF}$) has been generated according to digital signals in the first and the second stages. Therefore, in the third stage, the reference voltage $V_{REF}$ can be utilized, the input signal can be sampled, and the charges can be redistributed with the capacitor $C_1$ at the same time. Therefore, the integrator 310 can work correctly. Those skilled in the art can understand the following operation according to the above disclosure, and further description is thus omitted.

In addition, the reference generating circuit 200 shown in FIG. 2 can be utilized in a sigma-delta DAC. In general, the sigma-delta DAC can comprise a reference voltage generating circuit 200, a sigma-delta modulator, and a filter. As mentioned previously, the sigma-delta modulator also comprises an integrator and a quantizer. Therefore, in the following disclosure, the operations of the reference voltage generating circuit and the integrator are focused.

Figure 9:
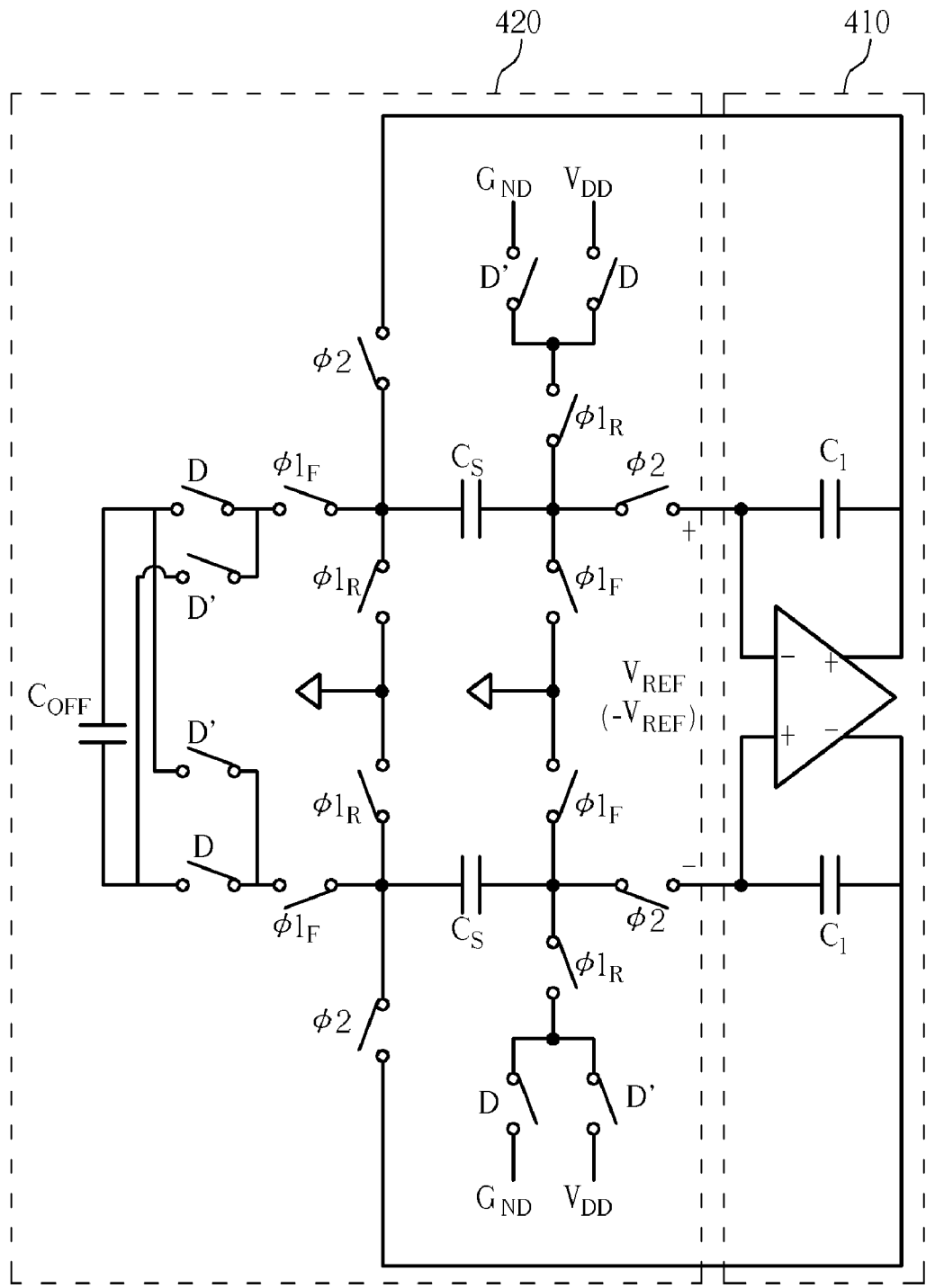
FIG. 9 is a detailed circuit diagram of an integrator and a reference voltage generating circuit in a sigma-delta DAC according to the present invention.

Please refer to FIG. 9, which is a detailed circuit diagram of an integrator 410 and a reference voltage generating circuit 420 in a sigma-delta DAC according to the present invention. As shown in FIG. 9, each switch also has a symbol indicating its corresponding control clock. The control clocks are also illustrated in FIG. 4. Moreover, in this embodiment, the sampling capacitor $C_S$ can also be utilized to generate the reference voltage $V_{REF}$, and its operation is detailed as follows.

Figure 10:
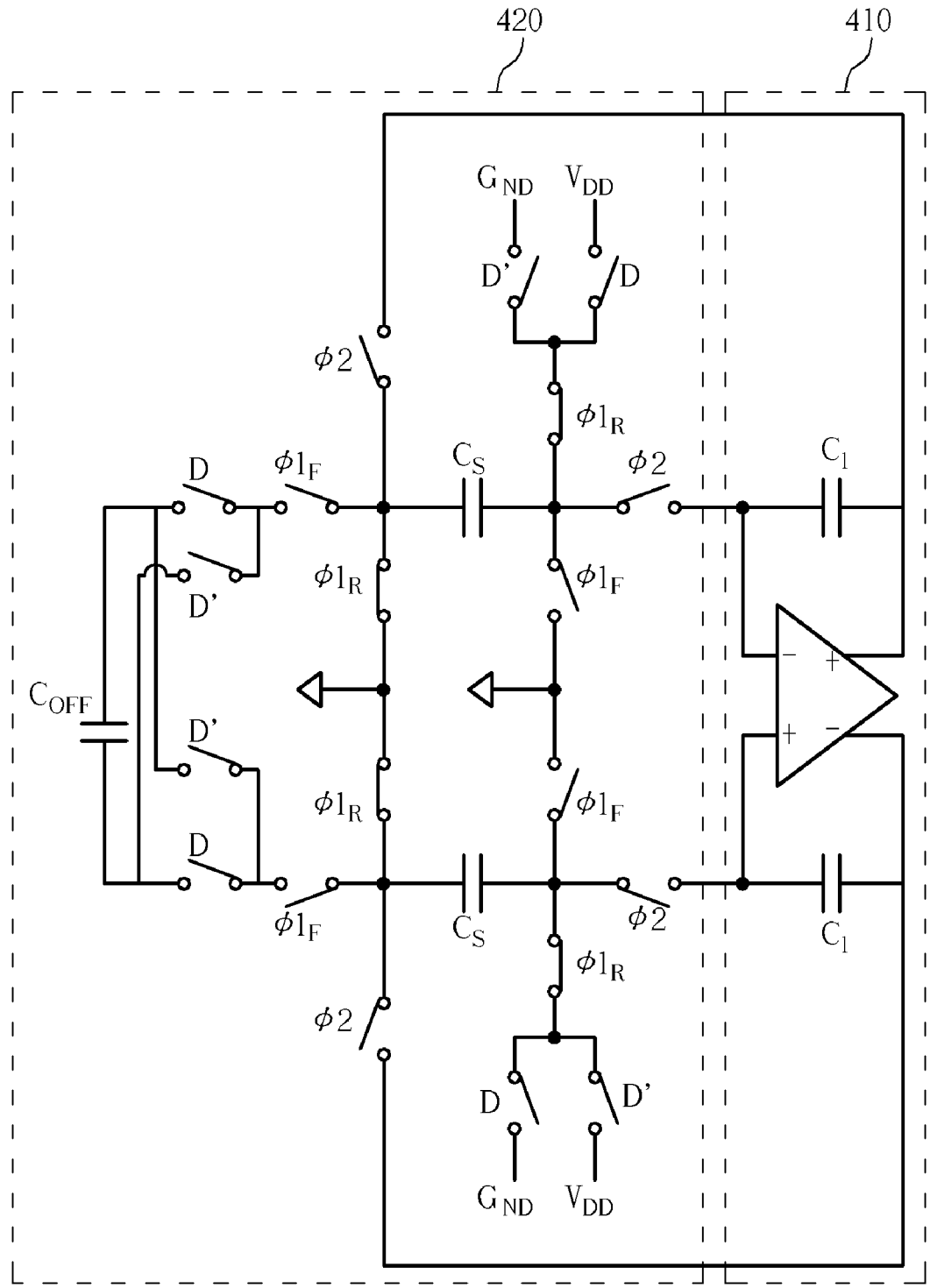
FIG. 10 is a diagram of the integrator and the reference voltage generating circuit shown in FIG. 9 in a first stage.

Please refer to FIG. 10, which is a diagram of the integrator 410 and the reference voltage generating circuit 420 shown in FIG. 9 in a first stage. In the first stage, the sampling capacitor $C_S$ is coupled to the external voltage source Vdd or the ground voltage GND according to the voltage level of an input digital signal in order to sample the external voltage source Vdd or the ground voltage GND.

Figure 11:
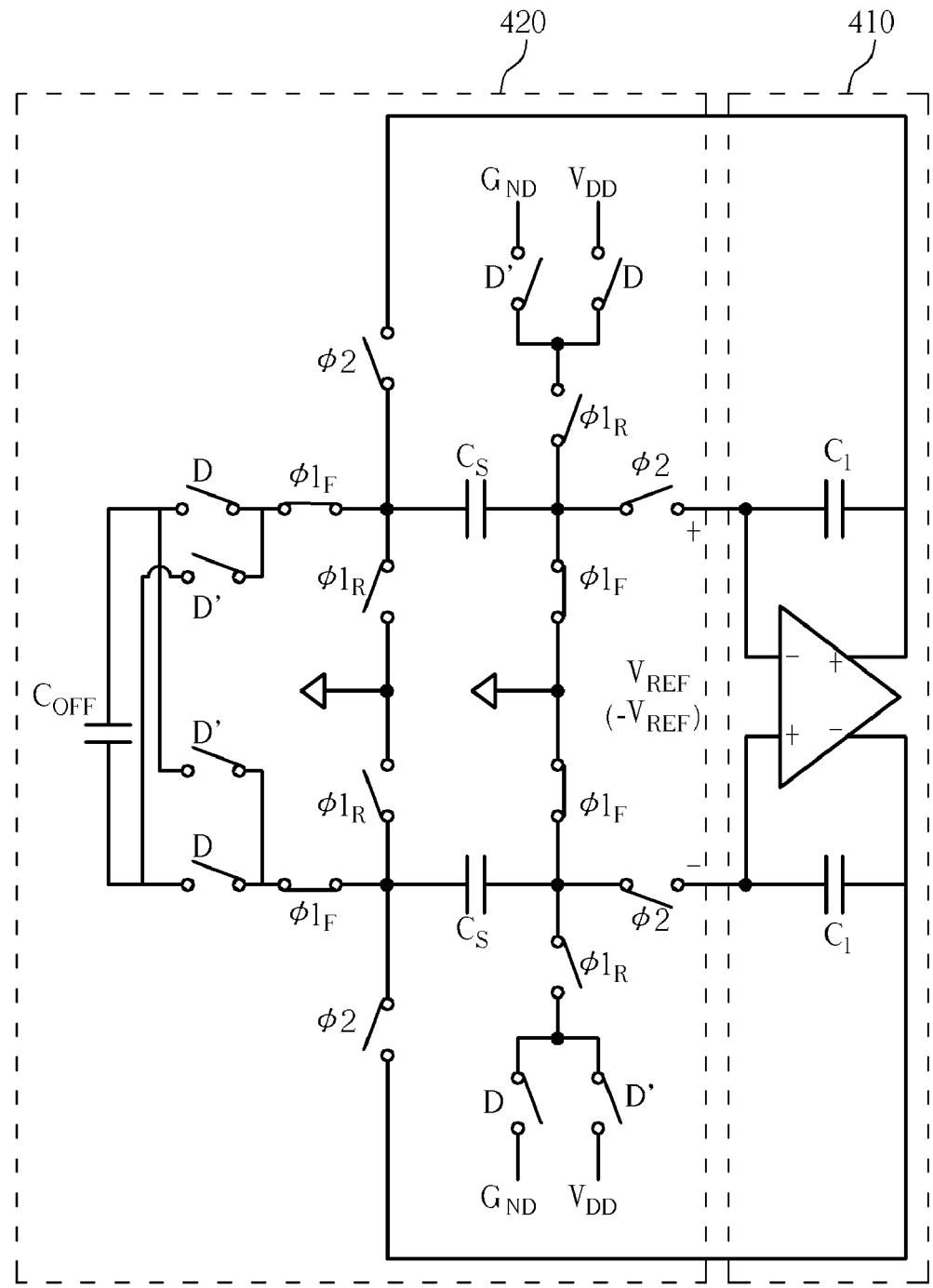
FIG. 11 is a diagram of the integrator and the reference voltage generating circuit shown in FIG. 9 in a second stage.

Please refer to FIG. 11, which is a diagram of the integrator 410 and the reference voltage generating circuit 420 shown in FIG. 9 in a second stage. In the second stage, the sampling capacitor $C_S$ is coupled to the off-chip capacitor $C_{OFF}$. Therefore, the sampling capacitor $C_S$ redistributes charges to the off-chip capacitor $C_{OFF}$ so that the reference voltage $V_{REF}$ is generated.

Figure 12:
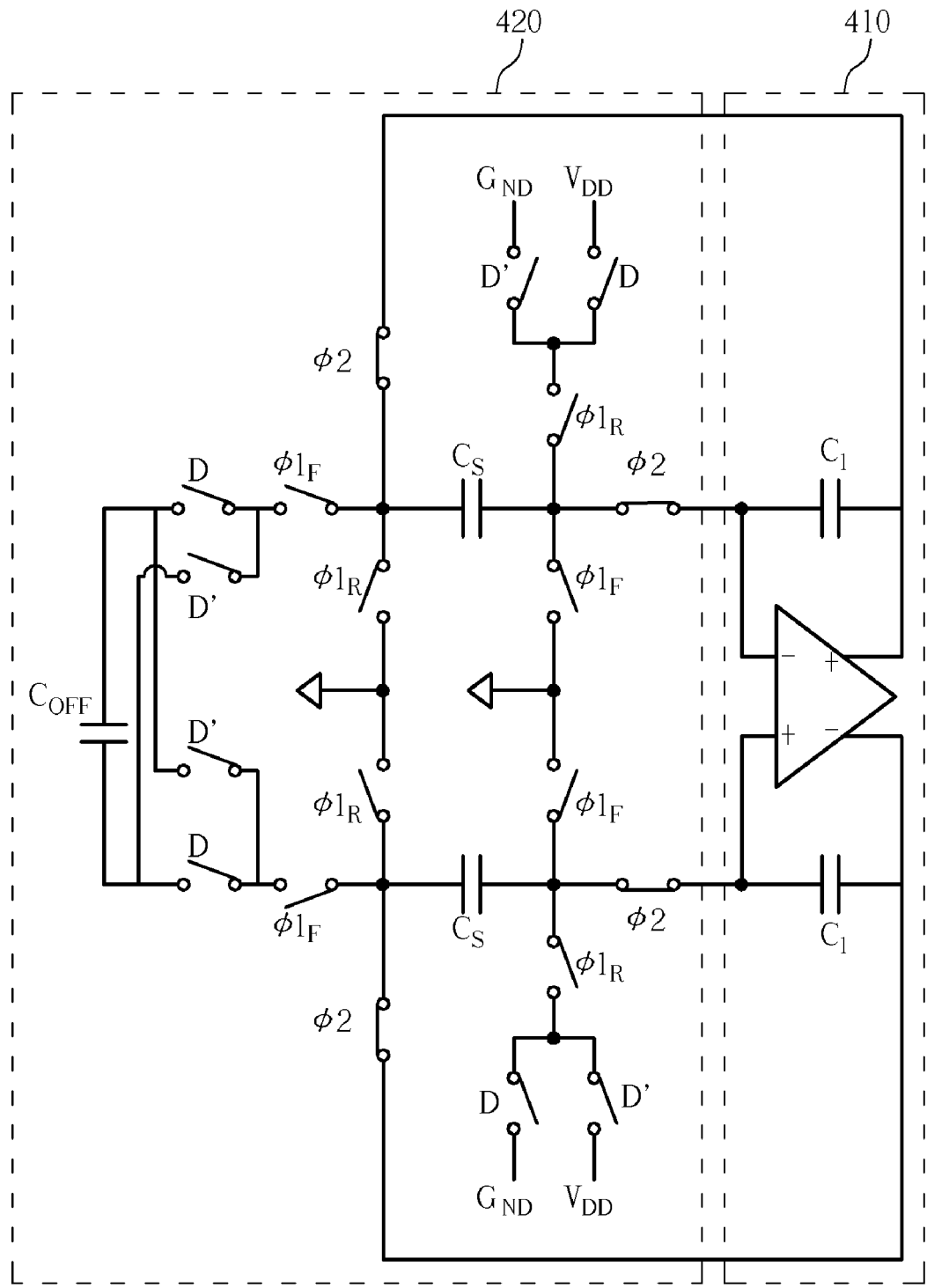
FIG. 12 is a diagram of the integrator and the reference voltage generating circuit shown in FIG. 9 in a third stage.

Please refer to FIG. 12, which is a diagram of the integrator 410 and the reference voltage generating circuit 420 shown in FIG. 9 in a third stage. In the third stage, the sampling capacitor $C_S$ stores charges corresponding to the reference voltage $V_{REF}$. Therefore, the sampling capacitor $C_S$ redistributes charges to the capacitor $C_I$, enabling the integrator 410 to work correctly, and the sigma-delta DAC to generate correct analog signals.

Figure 13:
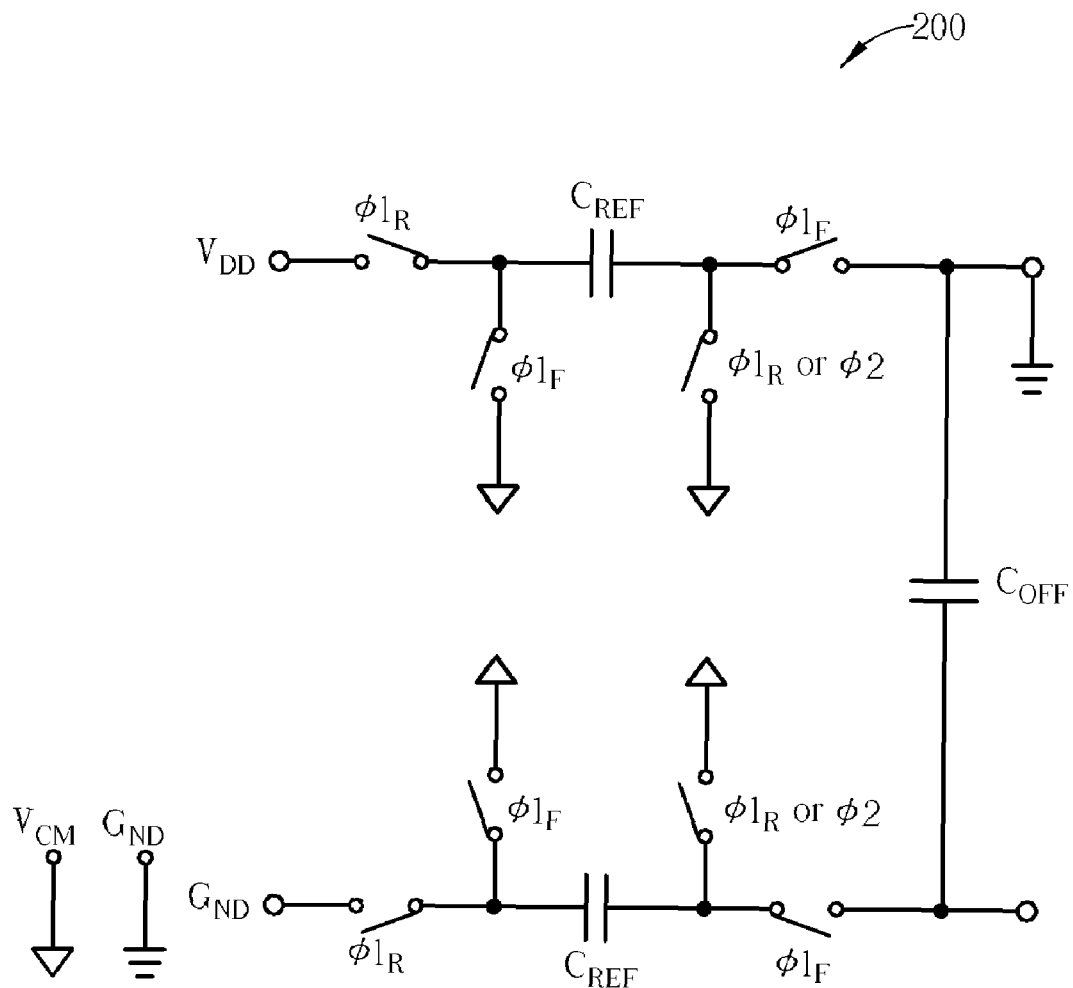
FIG. 13 is a diagram illustrating another embodiment of a reference voltage generating circuit according to the present invention.

Please refer to FIG. 13, which is a reference voltage generating circuit 200 shown in FIG. 2 of another embodiment according to the present invention. In this embodiment, one end of the off-chip capacitor $C_{OFF}$ is coupled to an external ground voltage GND, meaning that the end directly corresponds to a clean negative reference voltage. In addition, the reference voltage of the other end is generated by the voltage $V_{CM}$ and $G_{ND}$ so the reference voltage is not related to the voltage $V_{DD}$. Therefore, a good PSRR corresponding to $V_{DD}$ can be obtained.

Please note, in order to comply with a normal sigma-delta modulator, all circuits in the above disclosure are differential circuits. However, the present invention reference voltage generating circuit can also be utilized in a single-mode circuit, and which also obeys the spirit of the present invention.

In contrast to the prior art, the present invention reference voltage generating circuit can be utilized in a sigma-delta ADC and a sigma-delta DAC. Furthermore, the present invention reference voltage generating circuit can generate needed reference voltage without any resistors. This can save the cost, and the low-noise and low-frequency reference voltage can be smoothly generated for the following circuit to utilize.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sigma delta digital-to-analog converter comprising:
   a reference voltage generating circuit, for receiving a predetermined voltage and filtering the predetermined voltage to generate a reference voltage, the reference voltage generating circuit comprising:
   a first capacitor, comprising a first end and a second end;
   a second capacitor, comprising a third end and a fourth end,
   a first switch, for alternatively coupling the predetermined voltage to the second end of the first capacitor, wherein the first switch couples the predetermined voltage to the first capacitor in a first stage, and disconnects the predetermined voltage and the first capacitor in a second stage and a third stage;
   a second switch, for alternatively coupling the first end of the first capacitor to the third end of the second capacitor, wherein the second switch couples the third end of the second capacitor to the first end of the first capacitor in the second stage, and disconnects the first capacitor and the second capacitor in the first stage and the third stage;
   a third switch, for alternatively coupling the first end of the first capacitor to a reference level, wherein the third switch couples the first end of the first capacitor to the reference level in the first stage, and disconnects the first capacitor and the reference level in the second stage and the third stage;
   a fourth switch, for alternatively coupling the second end of the first capacitor to the reference level, wherein the fourth switch couples the second end of the first capacitor to the reference level in the second stage, and disconnects the first capacitor and the reference level in the first stage and the third stage;
   wherein the first capacitor samples the predetermined voltage in the first stage, and redistributes charges to the second capacitor in the second stage in order to generate the reference voltage; and
   a sigma delta modulator, for receiving the reference voltage from the reference voltage generating circuit and generating an analog signal according to a digital signal in the third stage.

2. The sigma delta digital/analog converter of claim 1, wherein the first switch and the third switch are controlled by a first clock, the second switch and the fourth switch are controlled by a second clock, and the sigma delta modulator is controlled by the first clock, the second clock, and a third clock.

3. The sigma delta digital/analog converter of claim 1, wherein the reference level corresponds to a ground voltage level.

4. A sigma delta analog-to-digital converter comprising:
a reference voltage generating circuit, for receiving a predetermined voltage and filtering the predetermined voltage to generate a reference voltage, the reference voltage generating circuit comprising:
a first capacitor, comprising a first end and a second end;
a second capacitor, comprising a third end and a fourth end;
a first switch, for alternatively coupling the second end of the first capacitor to the predetermined voltage, where the first switch couples the predetermined voltage to the first capacitor in a first stage, and disconnects the predetermined voltage and the first capacitor in a second stage and a third stage;
a second switch, for alternatively coupling the first end of the first capacitor to the third end of the second capacitor, where the second switch couples the third end of the second capacitor to the first end of the first capacitor in the second stage, and disconnects the first capacitor and the second capacitor in the first stage and the third stage;
a third switch, for alternatively coupling the first end of the first capacitor to a reference level, where the third switch couples the first end of the first capacitor to the reference level in the first stage, and disconnects the first capacitor and the reference level in the second stage and the third stage; and
a fourth switch, alternatively coupling the second end of the first capacitor to the reference level, where the fourth switch couples the second end of the first capacitor to the reference level in the second stage, and disconnects the first capacitor and the reference level in the first stage;
wherein the first capacitor samples the predetermined voltage in the first stage, and redistributes charges to the second capacitor in the second stage to generate the reference voltage;
a sigma delta modulator, for receiving the reference voltage in the third stage, and receiving an input analog signal in the first and the second stages to generate a digital signal.

5. The sigma delta analog/digital converter of claim 4, wherein the first switch and the third switch are controlled by a first clock, the second switch is controlled by a second clock, the fourth switch is controlled by the first clock and a third clock, and the sigma delta modulator is controlled by the first, the second, and the third clocks.

6. The sigma delta analog/digital converter of claim 4, wherein the reference level corresponds to a ground voltage level.

* * * * *